United States Patent
Wang (10) Patent No.: US 12,513,832 B2
(45) Date of Patent: Dec. 30, 2025

(54) CLOSED MODULAR DISTRIBUTION FRAME

(71) Applicant: Jiangsu Enmane Electronics Industry Co., Ltd, Jiangsu (CN)

(72) Inventor: Chuanbao Wang, Jiangsu (CN)

(73) Assignee: Jiangsu Enmane Electronics Industry Co., Ltd, Kunshan (CN)

( * ) Notice: Subject to any disclaimer, the term of this patent is extended or adjusted under 35 U.S.C. 154(b) by 425 days.

(21) Appl. No.: 18/060,567

(22) Filed: Nov. 30, 2022

(65) Prior Publication Data

US 2024/0080999 A1  Mar. 7, 2024

(30) Foreign Application Priority Data

Sep. 7, 2022  (CN) .......................... 202211089644.3

(51) Int. Cl.
| | |
|---|---|
| *H01R 13/518* | (2006.01) |
| *H01R 9/24* | (2006.01) |
| *H01R 13/506* | (2006.01) |
| *H01R 13/58* | (2006.01) |
| *H05K 5/00* | (2006.01) |

(52) U.S. Cl.
CPC ......... *H05K 5/0069* (2013.01); *H01R 9/2416* (2013.01); *H01R 13/506* (2013.01); *H01R 13/518* (2013.01); *H01R 13/5812* (2013.01)

(58) Field of Classification Search
None
See application file for complete search history.

(56) References Cited

U.S. PATENT DOCUMENTS

| | | | | | |
|---|---|---|---|---|---|
| 5,370,541 | A | * | 12/1994 | Bossard | H01R 9/24 439/713 |
| 5,755,593 | A | * | 5/1998 | Pepe | H01R 13/743 248/27.3 |
| 7,059,915 | B1 | * | 6/2006 | Schempp | H01R 13/743 439/676 |
| 7,118,414 | B2 | * | 10/2006 | Spears | H01R 13/506 439/540.1 |
| 7,689,089 | B2 | * | 3/2010 | Wagner | H04Q 1/13 385/134 |
| 7,722,402 | B2 | * | 5/2010 | Pepe | H01R 13/518 439/607.18 |
| 7,909,619 | B2 | * | 3/2011 | Pepe | H01R 13/743 439/541.5 |
| 11,279,537 | B2 | * | 3/2022 | Wang | B65D 63/1027 |
| 2002/0048996 | A1 | * | 4/2002 | Beck | H01R 13/68 439/620.27 |
| 2005/0178573 | A1 | * | 8/2005 | James | H01R 13/60 174/50.6 |

* cited by examiner

*Primary Examiner* — Felix O Figueroa
(74) *Attorney, Agent, or Firm* — Zhigang Ma (57) ABSTRACT

The present application discloses a closed modular distribution frame, which includes a distribution frame body. The distribution frame body is a closed box body. The closed modular distribution frame further includes a grounding wire. The grounding wire is mounted inside the distribution frame body. The whole distribution frame body is made of a metal structural material, is a closed box body and is closely connected through the fastening assemblies, thus achieving higher firmness and durability, having good sealing performance and dustproof performance, having a protective effect on the interior of the distribution frame body, and effectively increasing the service life of the product.

8 Claims, 8 Drawing Sheets

CLOSED MODULAR DISTRIBUTION FRAME

CROSS REFERENCE TO RELATED APPLICATIONS

The present application claims the benefit of Chinese Patent Application No. 202211089644.3 filed on Sep. 7, 2022, the contents of which are incorporated herein by reference in their entirety.

TECHNICAL FIELD

The present application relates to the field of network wiring devices, in particular to a closed modular distribution frame.

BACKGROUND

A distribution frame is a device used for terminal user lines or trunk lines and capable of deploying and connecting them. The distribution frame is the most important assembly in the management subsystem, and is the hub to realize the cross connection between the vertical trunk line and horizontal cabling subsystems. A modular distribution frame is applicable to the mounting and fixing of network modules in the middle of the network device. A network cable from a switch is connected to a network cable from a crystal head to a working side through the network modules mounted and fixed in the distribution frame.

The distribution frame is usually mounted on a cabinet, a multimedia box, a wall or a desktop. In the application of the distribution frame, the application scenarios are more and more diversified. Nowadays, modular distribution frames on the market are thick and ugly, and semi-closed structures cannot meet the relevant requirements of dust prevention and moisture prevention, and are not easy to mount. Therefore, it is necessary to design a new closed modular distribution frame which is convenient to mount and operate to meet the needs of the market.

SUMMARY

In order to overcome the disadvantages, the purpose of the present application is to provide a closed modular distribution frame.

In order to achieve the purpose, the present application adopts the following technical solution: a closed modular distribution frame, including a distribution frame body, wherein the distribution frame body is a closed box body, the closed modular distribution frame further includes a grounding wire, the grounding wire is mounted inside the distribution frame body, at least two network wiring ports are provided in a sidewall of the box body, and the height of the network wiring ports accounts for less than or equal to 58.3% of the height of the distribution frame body.

Generally, the height of the network wiring ports is 10.5 mm. In the present application, the thickness of the distribution frame body ranges from 18 mm to 33 mm. The height of the network wiring ports accounts for 31.8%-58.3% of the height of the distribution frame body.

The proportion of the height of the network wiring ports to the height of the distribution frame body is limited. This is because the smaller the thickness of the distribution frame body is designed, the greater the proportion of the height of the network wiring ports to the height of the distribution frame body. Compared with the existing network distribution frame, the height of the network wiring ports in the present application is unchanged, the thickness is reduced, and the miniaturization design saves space, is more beautiful, and reduces the transportation cost. The whole distribution frame is a closed box body and is made of a metal structural material, thus achieving higher firmness and durability, having good sealing performance and dustproof performance, having a protective effect on the interior of the distribution frame body, and effectively increasing the service life of the product.

Further, the box body includes an upper cover and a bottom shell, and the upper cover and the bottom shell are fastened together through a fastening assembly.

Further, the fastening assembly includes fastening grooves, at least one group of fastening grooves is provided in inner walls of two sides of the bottom shell, inner walls of two sides of the upper cover are provided with fasteners corresponding to the fastening grooves, and the size of the fastening grooves is fit with the size of the fasteners. The provision of the fastening grooves and the fasteners can achieve firm connection between the upper cover and the bottom shell.

Further, at least one group of mounting assemblies is symmetrically provided on the bottom shell, and each group of mounting assemblies includes two hanging holes provided symmetrically. It can be mounted on a wall, directly placed on a slideway, a multimedia box or cabinet, or mounted in other mounting ways. Moreover, it is convenient to mount.

Further, a module fixing position is provided in the distribution frame body, network modules are placed at the module fixing position, and the network modules correspond to the network wiring ports one to one.

Further, an extension plate is further provided on the box body, positioning holes are provided in the extension plate, positioning blocks are provided on the network modules, and the positioning holes are fit with the positioning blocks. The positioning blocks extend into the positioning holes to facilitate accurate positioning during mounting.

Further, limiting holes are provided in the bottom shell, bottoms of the network modules are provided with elastic clamps, and the size of the limiting holes is fit with the elastic clamps. Pressing the elastic clamp can extend it into the limiting hole for clamping. The provision of the limiting holes facilitates the quick disassembling and assembling of the network modules.

Further, a PCB is further provided in the box body, electric plug cores located in the network wiring ports are provided on the PCB, terminal bases are further provided on the PCB, cable cutters are in plugging connection with the terminal bases, a cable limiting post is provided above each terminal base, a top of each cable cutter stretches into the cable limiting post and is used for cutting a cable in the cable limiting post to contact a conductor in the cable to achieve data transmission.

Further, a sidewall of one end of the bottom shell is provided with a cable arranging rack, the cable arranging rack is located inside the box body, several equidistant mounting bases are provided on the cable arranging rack, and a plurality of clamping bases are provided on the mounting bases.

Further, a cable tie is further provided in the box body, the cable tie is fixed on the clamping base, the cable tie includes a semicircular fastener and a toothed elastic piece, the toothed elastic piece is mounted at one end of the semicircular fastener, and a part between the toothed elastic piece and the semicircular fastener is an arc-shaped hollowed-out part.

Further, two sides of the distribution frame body are provided with connecting lug structures, outer surfaces of the connecting lug structures are provided with screw holes, and the connecting lug structures are integrally or detachably connected with the box body. When in use, the user firstly aligns the connecting lug structures on two sides of the distribution frame body with the mounting surface, then passes fixing screws through the screw holes and screws them tightly.

Further, rear clamping pieces are provided inside the distribution frame body, the rear clamping pieces are provided inside the distribution frame body for clamping the network modules, the thickness of the distribution frame body ranges from 23 mm to 33 mm, and the height of the network wiring ports accounts for 31.8%-45.7% of the height of the distribution frame body which is the box body.

Beneficial effects: the proportion of the height of the network wiring ports to the height of the distribution frame body is limited. This is because the smaller the thickness of the distribution frame body is designed, the greater the proportion of the height of the network wiring port to the height of the distribution frame body. Compared with the existing network distribution frame, the height of the network wiring ports in the present application is unchanged, the thickness is reduced, and the miniaturization design saves space, is more beautiful, and reduces the transportation cost. At the same time, the interior of the distribution frame body adopts modular design, thus facilitating the mounting. The whole distribution frame body is made of a metal structural material, is a closed box body and is closely connected through the fastening assemblies, thus achieving higher firmness and durability, having good sealing performance and dustproof performance, having a protective effect on the interior of the distribution frame body, and effectively increasing the service life of the product.

In the drawings, 1—distribution frame body; 2—box body; 21—upper cover; 22—bottom shell; 3—network module; 4—mounting base; 5—cable tie; 51—semicircular fastener; 52—toothed elastic piece; 53—arc-shaped hollowed-out part; 6—cable arranging rack; 7—grounding wire; 8—network wiring port; 9—module fixing position; 10—fastening assembly; 101—fastening groove; 102—fastener 11—extension plate; 111—positioning hole; 12—positioning block; 13—limiting hole; 14—elastic clamp; 15—mounting assembly; 151—mounting hole; 152—hanging hole; 16—clamping base; 17—connecting lug structure; 171—screw hole; 18—rear clamping piece; 19—PCB; 20—electric plug core; 23—terminal base; 231—cable cutter; 232—cable limiting post.

DESCRIPTION OF THE EMBODIMENTS

The preferred embodiments of the present application will be described in detail below with reference to the drawings, so that the advantages and features of the present application can be more easily understood by those skilled in the art, and the scope of protection of the present application can be more clearly defined.

Embodiment 1

Figure 1:
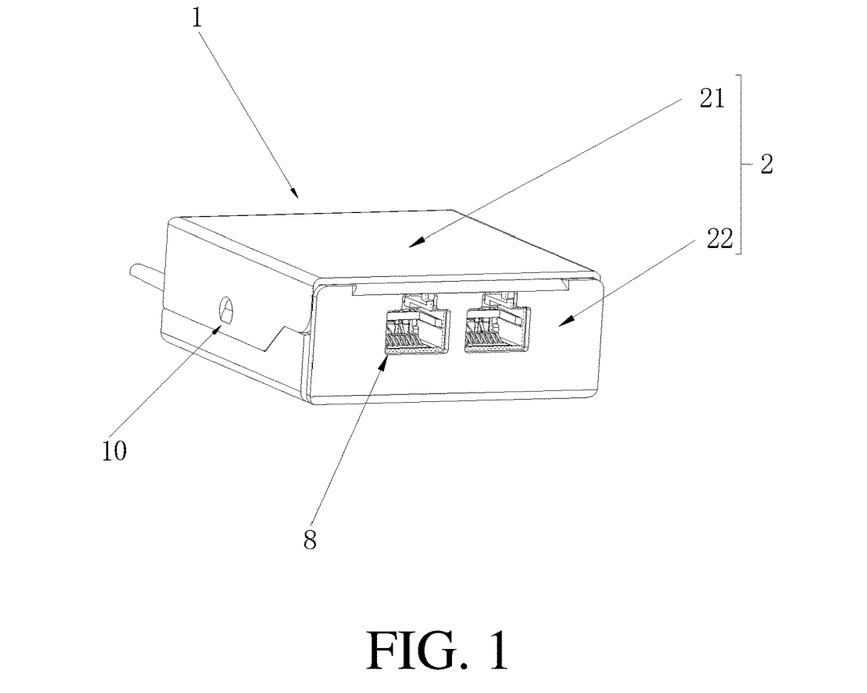
FIG. 1 is a schematic 3D structural diagram I of a closed modular distribution frame according to embodiment 1 of the present application.
Figure 2:
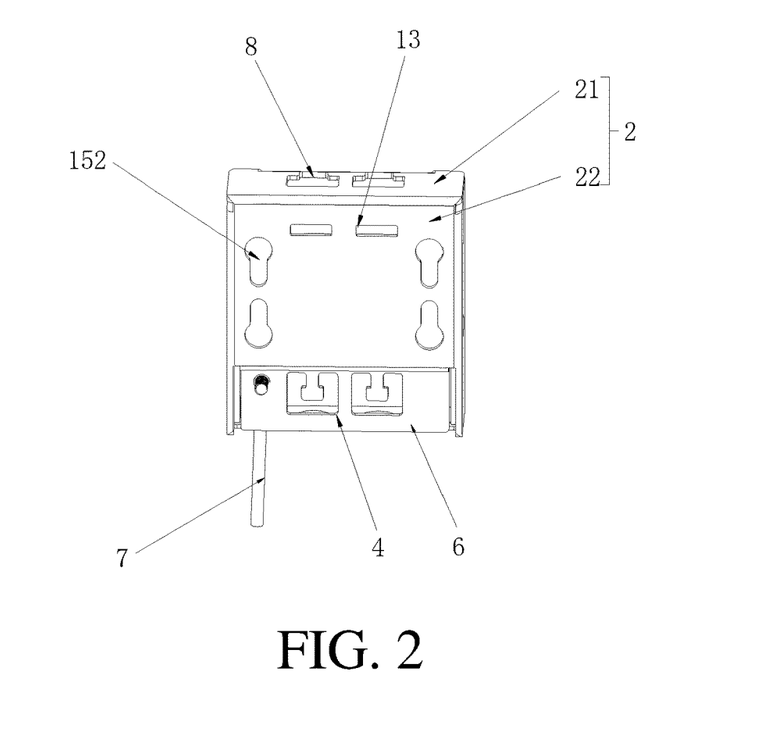
FIG. 2 is a schematic 3D structural diagram II of a closed modular distribution frame according to embodiment 1 of the present application.

Referring to FIGS. 1 and 2, a closed modular distribution frame in this embodiment includes a distribution frame body 1. In this embodiment, the distribution frame body 1 is a 2-port distribution frame body. The distribution frame body 1 is a closed box body 2. The closed modular distribution frame further includes a grounding wire 7. The grounding wire is mounted inside the distribution frame body 1. Several equidistant network wiring ports 8 are provided in an inner wall of one side of the distribution frame body 1. The height of the network wiring ports 8 accounts for less than or equal to 58.3% of the height of the panel body 1.

In some embodiments, the thickness of the existing distribution frame body 1 is 22.5 mm. In the present application, the thickness of the distribution frame body 1 ranges from 18 mm to 33 mm. Generally, the height of the network wiring ports is 10.5 mm. When the thickness of the distribution frame body 1 is 18 mm, it is the case that the thickness is the smallest. Thus, the height of the network wiring ports 8 accounts for 58.3% (10.5 mm/18 mm) of the height of the distribution frame body 1. When the thickness of the distribution frame body 1 is 33 mm, it is the case that the thickness is the largest, the height of the network wiring ports 8 in the application document accounts for 31.8% (10.5 mm/33 mm) of the height of the distribution frame body 1, and the proportion of the height of the network wiring ports 8 to the height of the distribution frame body 1 ranges from 31.8% to 58.3%, In some possible embodiments, the height of the network wiring ports 8 is 10.5 mm. Since the thickness of the distribution frame body 1 in the present application ranges from 18 mm to 33 mm, the thickness of the distribution frame body 1 may also be any thickness between 18 mm and 33 mm. For example, the thickness of the distribution frame body 1 may also be 21 mm, 25 mm, or 28 mm. When the thickness of the distribution frame body 1 is 21 mm, the height of the network wiring ports 8 accounts for 50% (10.5 mm/21 mm) of the height of the distribution frame body 1. When the thickness of the distribution frame body 1 is 25 mm, the height of the network wiring ports 8 accounts for 42% (10.5 mm/25 mm) of the height of the distribution frame body 1. When the thickness of the distribution frame body 1 is 28 mm, the height of the network wiring ports 8 accounts for 37.5% (10.5 mm/28 mm) of the height of the distribution frame body 1.

The proportion of the height of the network wiring ports 8 to the height of the distribution frame body 1 is limited. This is because the smaller the thickness of the distribution frame body 1 is designed, the greater the proportion of the height of the network wiring ports 8 to the height of the distribution frame body 1. Compared with the existing network distribution frame 1, the height of the network wiring ports in the present application is unchanged, the thickness is reduced, and the miniaturization design saves space, is more beautiful, and reduces the transportation cost. At the same time, the whole distribution frame is a closed box body and is made of a metal structural material, thus achieving higher firmness and durability, having good sealing performance and dustproof performance, having a protective effect on the interior of the distribution frame body 1, and effectively increasing the service life of the product.

In some possible embodiments, in combination with FIG. 7-12, according to the functional configuration requirements of the product, the distribution frame body 1 may also be a distribution frame body 1 with a different number of network wiring ports 8, such as 2, 4, 6, 8, 12 or 24 ports. The thickness of the distribution frame in this application document ranges from 18 mm to 33 mm. When a different number of network wiring ports 8 are provided to meet different capacity requirements, the capacity can be expanded in the horizontal direction, so that the length of the distribution frame body will change, but the thickness will not change. Compared with the existing distribution frame, the overall thickness is reduced, the interior adopts modular design, it is convenient to mount and can be hung on a wall or placed on a desktop, and the appearance is simpler and more attractive.

In some embodiments, the box body 2 includes an upper cover 21 and a bottom shell 22. The upper cover 21 and the bottom shell 22 are fastened together through a fastening assembly 10.

Figure 3:
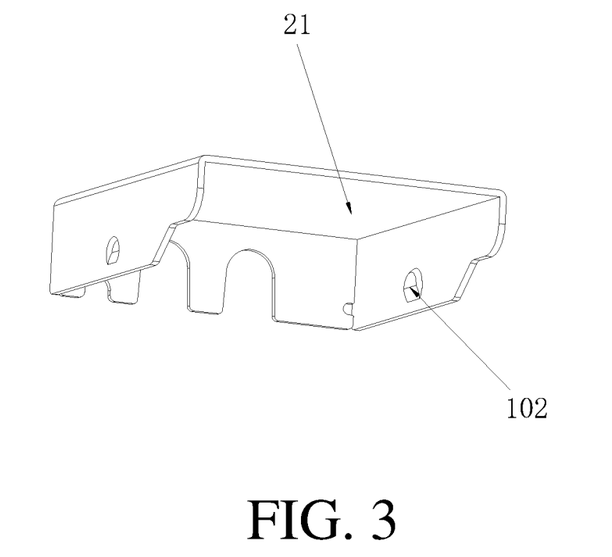
FIG. 3 is a schematic 3D structural diagram of an upper cover according to embodiment 1 of the present application.
Figure 4:
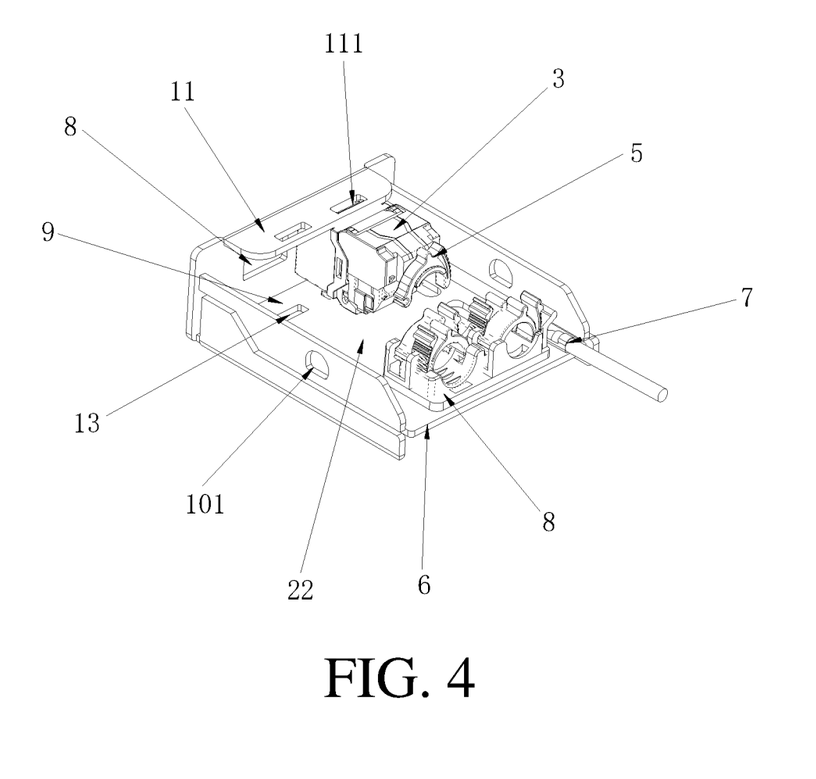
FIG. 4 is a schematic 3D structural diagram of an interior of a box body according to embodiment 1 of the present application.

In some embodiments, the fastening assembly 10 includes fastening grooves 101. At least one group of fastening grooves 101 is provided in inner walls of two sides of the bottom shell 22. The fastening grooves 101 may be in various shapes, such as round, rectangular, triangular and diamond. As a preferred method, referring to FIG. 3-4, the fastening grooves 101 are semi-circular. Inner walls of two sides of the upper cover 21 are provided with fasteners 102 corresponding to the fastening grooves 101. The size of the fastening grooves 101 is fit with the size of the fasteners. The provision of the fastening grooves 101 and the fasteners 102 can achieve the firm connection between the upper cover 21 and the bottom shell 22.

In some embodiments, referring to FIG. 2, at least one group of mounting assemblies 15 is symmetrically provided on the bottom shell 22, and each group of mounting assemblies 15 includes two hanging holes 152 provided symmetrically. It can be mounted on a wall, directly placed on a slideway, a multimedia box or cabinet, or mounted in other mounting ways. Moreover, it is convenient to mount.

In some possible embodiments, each group of mounting assemblies 15 further includes a mounting hole 151 provided between the two hanging holes 152.

In some embodiments, a module fixing position 9 is provided in the distribution frame body 1, network modules 3 are placed at the module fixing position 9, and the network modules 3 correspond to the network wiring ports 8 one to one.

In some embodiments, an extension plate 11 is further provided on the box body 2, positioning holes 111 are provided in the extension plate 11, positioning blocks 12 are provided on the network modules 3, and the positioning holes 111 are fit with the positioning blocks 12. The positioning blocks 12 extend into the positioning holes 111 to facilitate accurate positioning during mounting.

Figure 5:
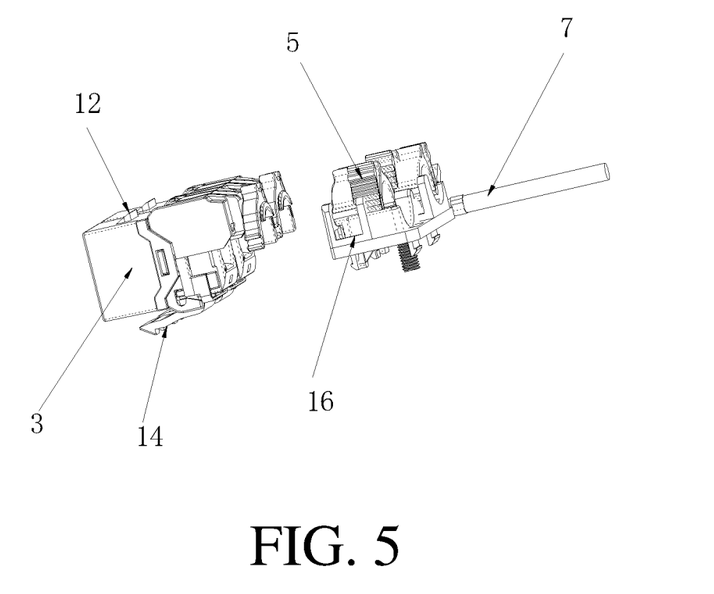
FIG. 5 is a schematic 3D structural diagram of a network module according to embodiment 1 of the present application.

In some embodiments, limiting holes 13 are provided in the bottom shell 22, referring to FIG. 5, bottoms of the network modules 3 are provided with elastic clamps 14, and the size of the limiting holes 13 is fit with the elastic clamps 14. Pressing the elastic clamp 14 can extend it into the limiting hole 13 for clamping. The provision of the limiting holes 13 facilitates the quick disassembling and assembling of the network modules 3.

The elastic clamps 14 are made of an elastic material. The elastic material is a material that deforms under the action of an external force and can quickly restore its original shape after the external force is withdrawn, such as spring steel, polyethylene or POE.

Figure 8:
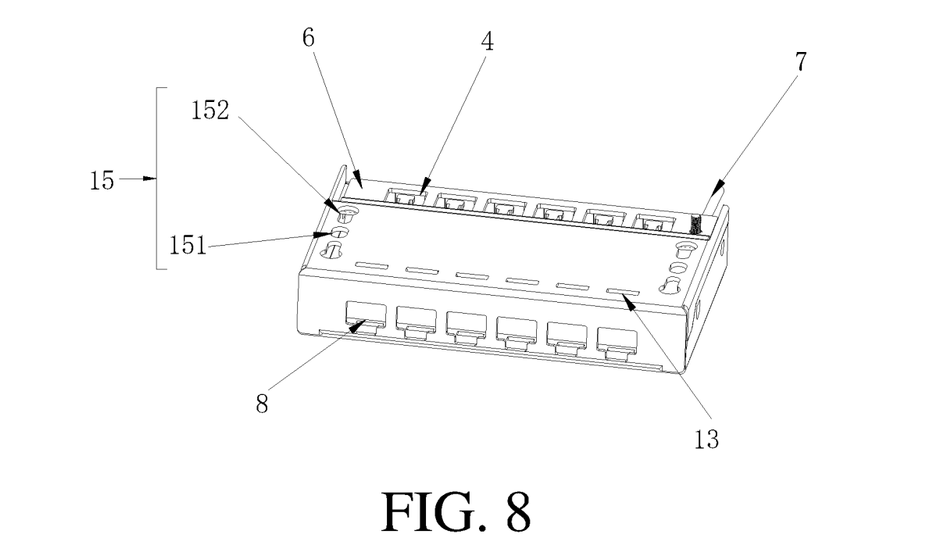
FIG. 8 is a schematic 3D structural diagram of a 6-port closed modular distribution frame according to embodiment 1 of the present application.
Figure 9:
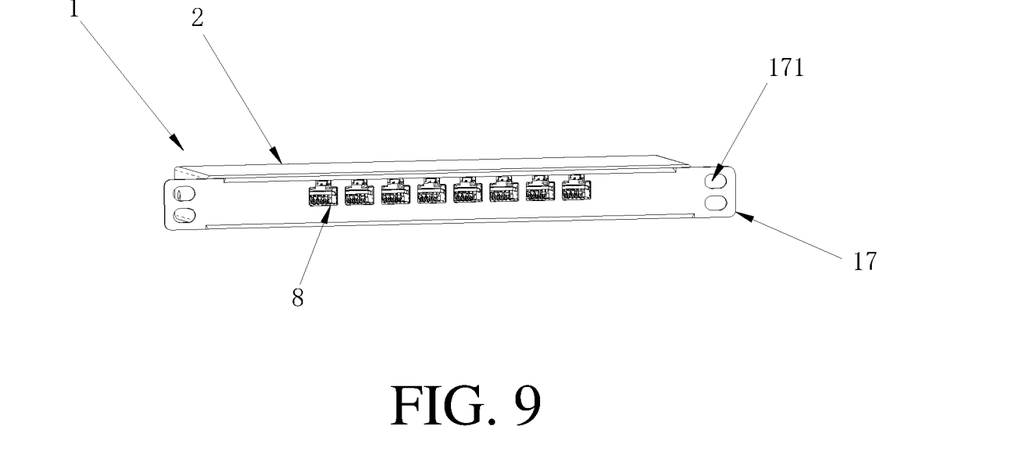
FIG. 9 is a schematic 3D structural diagram of an 8-port closed modular distribution frame with connecting lug structures according to embodiment 1 of the present application.
Figure 10:
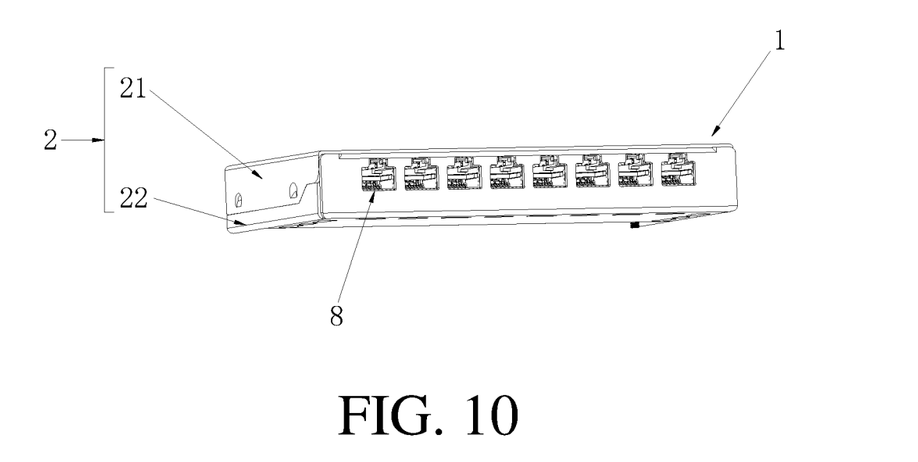
FIG. 10 is a schematic 3D structural diagram of an 8-port closed modular distribution frame without connecting lug structures according to embodiment 1 of the present application.
Figure 11:
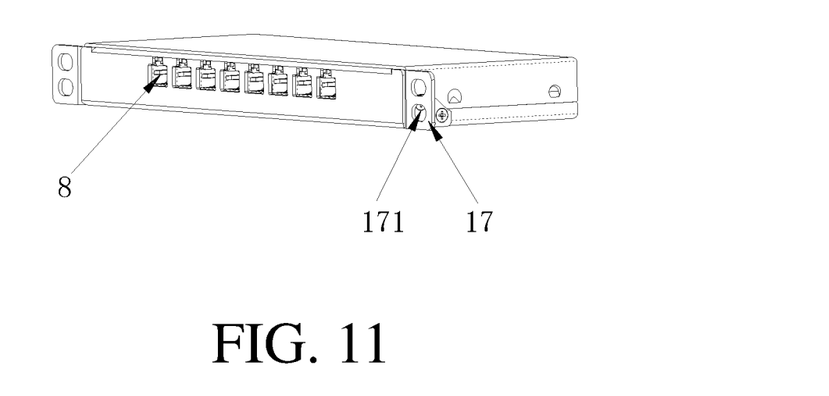
FIG. 11 is a schematic 3D structural diagram of an 8-port closed modular distribution frame with detachable connecting lug structures according to embodiment 1 of the present application.
Figure 12:
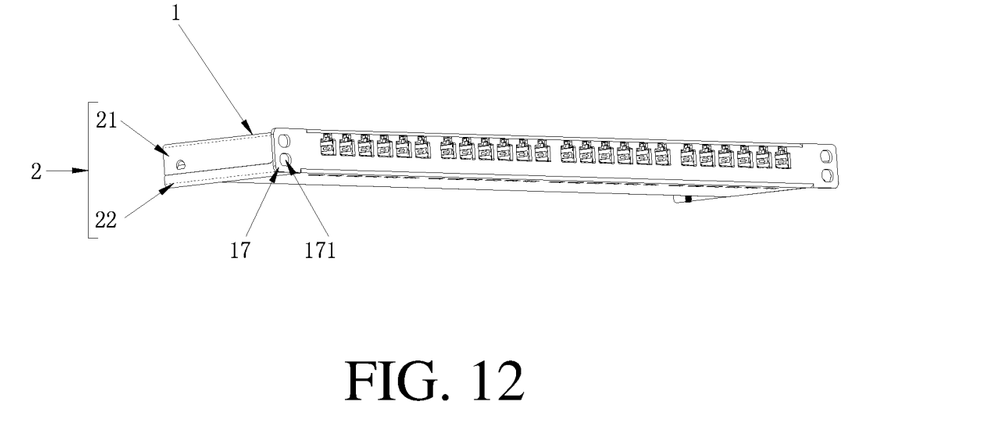
FIG. 12 is a schematic 3D structural diagram of a 24-port closed modular distribution frame according to embodiment 1 of the present application.

In some embodiments, referring to FIG. 8, a sidewall of one end of the bottom shell 22 is provided with a cable arranging rack 6, the cable arranging rack 6 is located inside the box body 2, several equidistant mounting bases 4 are provided on the cable arranging rack 6, the grounding wire is provided on one side of the mounting bases 4, and a plurality of clamping bases 16 are provided on the mounting bases 4.

Figure 6:
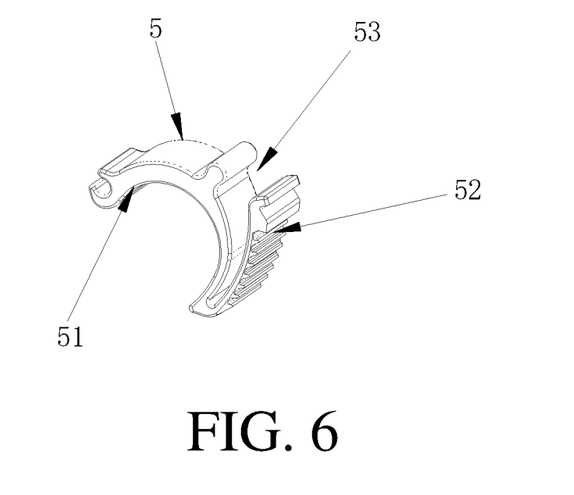
FIG. 6 is a schematic 3D structural diagram of a cable tie according to embodiment 1 of the present application.
Figure 7:
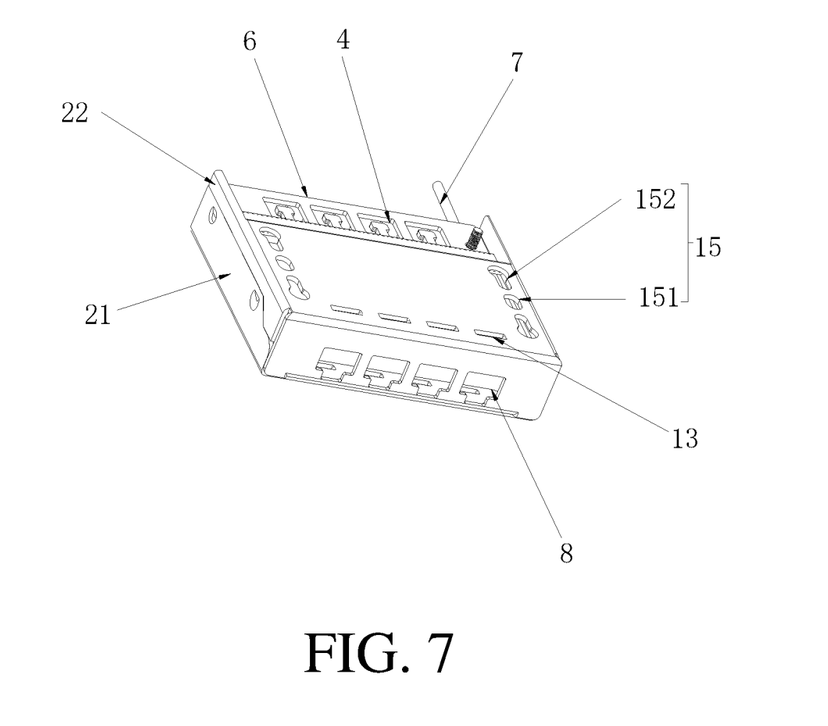
FIG. 7 is a schematic 3D structural diagram of a 4-port closed modular distribution frame according to embodiment 1 of the present application.

In some embodiments, referring to FIG. 6, a cable tie 5 is further provided in the box body 3. The cable tie 5 is fixed on the clamping base 16 and is used for fixing a cable harness, so that a network cable can be more easily arranged and replaced. The cable tie 5 includes a semicircular fastener 51 and a toothed elastic piece 52. The toothed elastic piece 52 is mounted at one end of the semicircular fastener 51. A part between the toothed elastic piece 52 and the semicircular fastener 51 is an arc-shaped hollowed-out part 53, so that the toothed elastic piece 50 has better elasticity.

In some possible embodiments, two sides of the box body 2 are provided with connecting lug structures 17. Outer surfaces of the connecting lug structures 17 are provided with screw holes 171. The connecting lug structures 17 are integrally or detachably connected with the box body 2. When in use, the user firstly aligns the connecting lug structures 17 on two sides of the distribution frame body 1 with the mounting surface, then passes fixing screws through the screw holes 171 and screws them tightly.

Embodiment 2

Provided is a closed modular distribution frame. In combination with FIG. 13, the difference of embodiment 2 from embodiment 1 is that rear clamping pieces 18 are provided inside the distribution frame body 1, the rear clamping pieces 18 are fixed inside the distribution frame body 1 by means such as screws for clamping the network modules 3. The thickness of the distribution frame body 1 ranges from 23 mm to 33 mm. The height of the network wiring ports 8 accounts for 31.8%-45.6% of the height of the distribution frame body 1 which is the box body 2.

Figure 13:
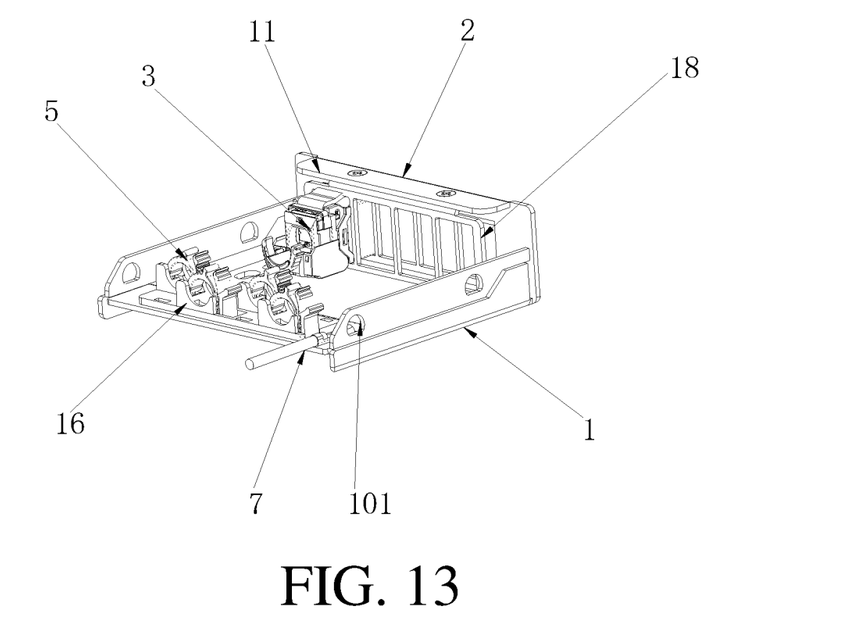
FIG. 13 is a schematic 3D structural diagram of a closed modular distribution frame according to embodiment 2 of the present application.

In some embodiments, the standard height of the network wiring ports 8 is 10.5 mm. In the present application, the thickness of the distribution frame body 1 is any thickness between 23 mm and 33 mm. When the thickness of the distribution frame body 1 is 23 mm, the height of the network wiring ports 8 accounts for 45.6% (10.5 mm/23 mm) of the height of the distribution frame body 1. When the thickness of the distribution frame body 1 is 33 mm, the height of the network wiring ports 8 accounts for 31.8% (10.5 mm/33 mm) of the height of the distribution frame body 1. The proportion of the height of the network wiring ports 8 to the height of the box body 2 ranges from 31.8% to 45.6%.

Embodiment 3

Figure 14:
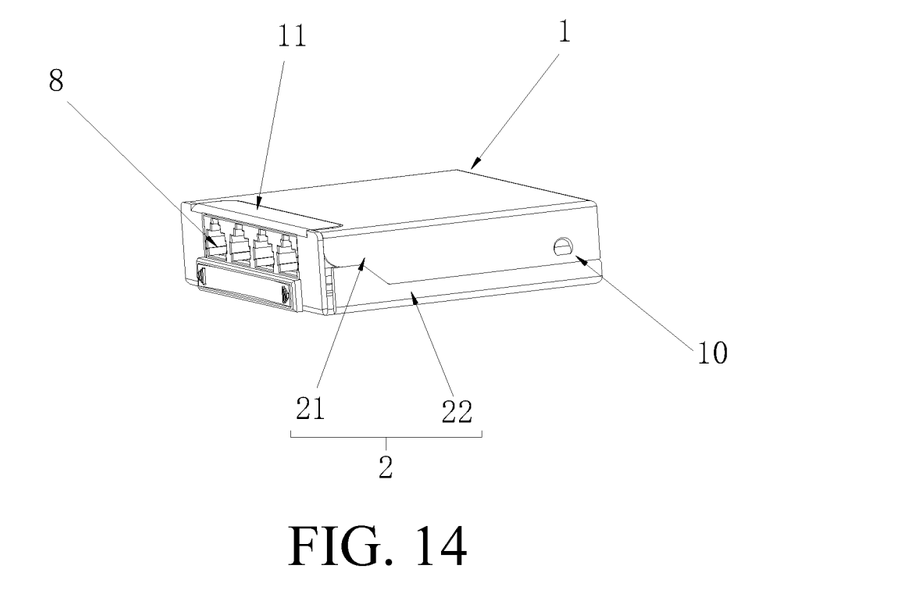
FIG. 14 is a schematic 3D structural diagram I of a 4-port closed modular distribution frame according to embodiment 3 of the present application.
Figure 15:
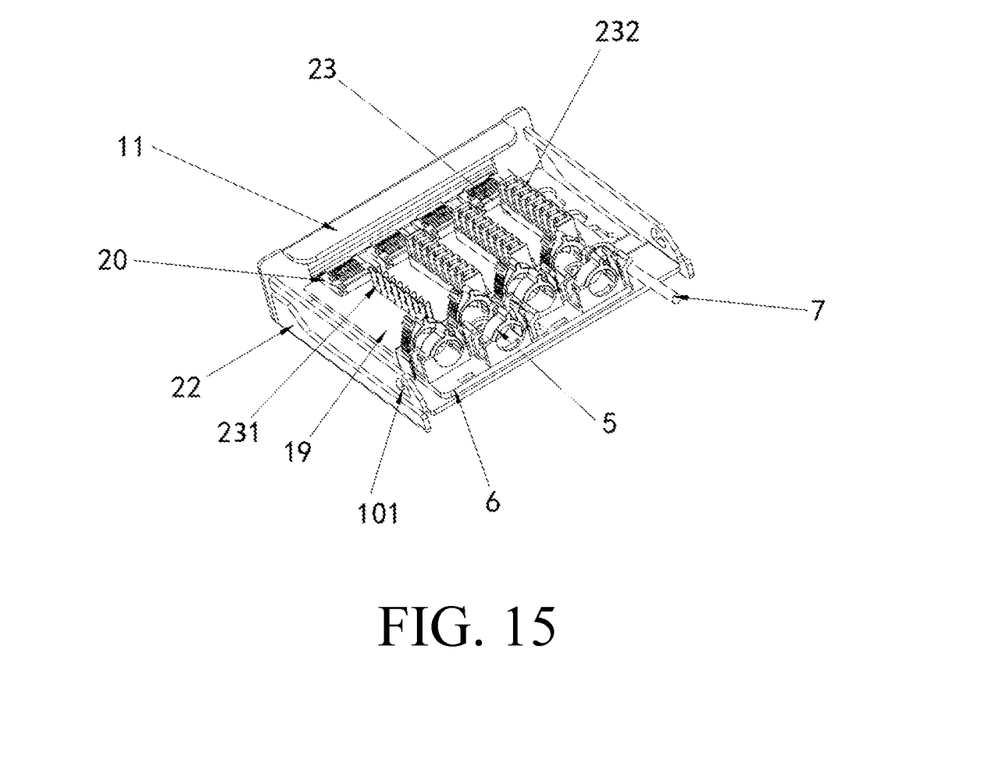
FIG. 15 is a schematic 3D structural diagram II of a 4-port closed modular distribution frame when an upper cover is removed according to embodiment 3 of the present application.
Figure 16:
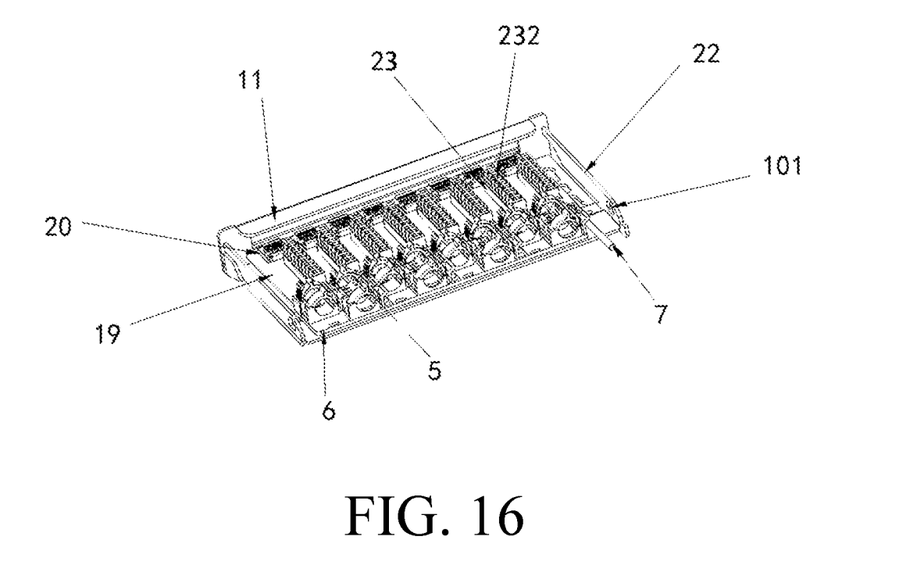
FIG. 16 is a schematic 3D structural diagram II of an 8-port closed modular distribution frame when an upper cover is removed according to embodiment 3 of the present application.

Provided is a closed modular distribution frame. In combination with FIG. 14-16, the distribution frame body is provided with four or eight network wiring ports 8. The difference of embodiment 3 from embodiment 1 is that a PCB 19 is further provided in the box body 2, electric plug cores 20 located in the network wiring ports 8 are provided on the PCB 19, terminal bases 23 are further provided on the PCB 19, cable cutters 231 are in plugging connection with the terminal bases 23, a cable limiting post 232 is provided above each terminal base 23, a top of each cable cutter 231 stretches into the cable limiting post 232 and is used for cutting a cable in the cable limiting post 232 to contact a conductor in the cable to achieve data transmission.

The above embodiments are only intended to describe the technical concept and features of the present application, are intended to enable those skilled in the art to understand the content of the present application and implement it, and are not intended to limit the scope of protection of the present application. Any equivalent changes or modifications made according to the spirit of the present application should be included in the scope of protection of the present application.

The invention claimed is:

1. A closed modular distribution frame, comprising a distribution frame body, wherein the distribution frame body is a closed box body, the closed modular distribution frame further comprises a grounding wire, the grounding wire is mounted inside the distribution frame body, at least two network wiring ports are provided in a sidewall of the box body, and the height of the network wiring ports accounts for less than or equal to 58.3% of the height of the distribution frame body;

wherein the box body comprises an upper cover and a bottom shell, and the upper cover and the bottom shell are detachably fastened together through a fastening assembly; the upper cover comprises a cover body, and a first sidewall, a second sidewall and a third sidewall extending downwards from the cover body; the bottom shell comprises a bottom, and a fourth sidewall, a fifth sidewall and a sixth sidewall extending upwards from the bottom, when the upper cover covers the bottom shell, the first sidewall is aligned with and fastened to the fourth sidewall, the second sidewall is aligned with and fastened to the fifth sidewall, the third sidewall is arranged opposite to the sixth sidewall, and the sixth sidewall servers as the sidewall providing the at least two network wiring ports;

the sixth sidewall together with the network wiring ports is exposed outside, and a module fixing position is provided in the distribution frame body, network modules are placed at the module fixing position, and the network modules correspond to the network wiring ports one to one;

wherein an extension plate is further provided on the box body, the extension plate is perpendicular to the sixth sidewall of the bottom shell, and extending inwards from the sixth sidewall to face and cover part of the network modules, and the extension plate and the upper cover cooperatively cover the bottom shell, thereby forming the closed box body; and wherein positioning holes are provided in the extension plate, positioning blocks are provided on the network modules, and the positioning holes are fit with the positioning blocks.

2. The closed modular distribution frame according to claim 1, wherein a thickness of the distribution frame body ranges from 18 mm to 33 mm, and a height of the network wiring ports accounts for 31.8%-58.3% of the height of the distribution frame body.

3. The closed modular distribution frame according to claim 1, wherein the fastening assembly comprises fastening grooves, at least one group of fastening grooves is provided in inner walls of two sides of the bottom shell, inner walls of two sides of the upper cover are provided with fasteners corresponding to the fastening grooves, and a size of the fastening grooves is fit with a size of the fasteners.

4. The closed modular distribution frame according to claim 1, wherein at least one group of mounting assemblies is symmetrically provided on the bottom shell, and each group of mounting assemblies comprises two hanging holes provided symmetrically.

5. The closed modular distribution frame according to claim 1, wherein limiting holes are provided in the bottom shell, bottoms of the network modules are provided with elastic clamps, and a size of the limiting holes is fit with the elastic clamps.

6. The closed modular distribution frame according to claim 1, wherein a sidewall of one end of the bottom shell is provided with a cable arranging rack, the cable arranging rack is located inside the box body, several equidistant mounting bases are provided on the cable arranging rack, and a plurality of clamping bases are provided on the mounting bases.

7. The closed modular distribution frame according to claim 6, wherein a cable tie is further provided in the box body, the cable tie is fixed on the clamping base, the cable tie comprises a semicircular fastener and a toothed elastic piece, the toothed elastic piece is mounted at one end of the semicircular fastener, and a part between the toothed elastic piece and the semicircular fastener is an arc-shaped hollowed-out part.

8. The closed modular distribution frame according to claim 1, wherein two sides of the distribution frame body are provided with connecting lug structures, outer surfaces of the connecting lug structures are provided with screw holes, and the connecting lug structures are integrally or detachably connected with the box body.

* * * * *